United States Patent
Cheng et al.

(10) Patent No.: US 10,833,165 B2
(45) Date of Patent: Nov. 10, 2020

(54) ASYMMETRIC AIR SPACER GATE-CONTROLLED DEVICE WITH REDUCED PARASITIC CAPACITANCE

(71) Applicant: International Business Machines Corporation, Armonk, NY (US)

(72) Inventors: Kangguo Cheng, Schenectady, NY (US); Juntao Li, Cohoes, NY (US); Son Nguyen, Schenectady, NY (US); Chanro Park, Saratoga, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/967,540

(22) Filed: Apr. 30, 2018

(65) Prior Publication Data
US 2019/0334009 A1 Oct. 31, 2019

(51) Int. Cl.
*H01L 29/66* (2006.01)
*H01L 29/51* (2006.01)
*H01L 29/78* (2006.01)

(52) U.S. Cl.
CPC ...... *H01L 29/515* (2013.01); *H01L 29/66795* (2013.01); *H01L 29/785* (2013.01)

(58) Field of Classification Search
CPC ................. H01L 29/515; H01L 29/785; H01L 29/66795
See application file for complete search history.

(56) References Cited

U.S. PATENT DOCUMENTS

| | | | |
|---|---|---|---|
| 7,585,735 B2 | 9/2009 | Mathew et al. | |
| 7,892,928 B2 | 2/2011 | Cheng et al. | |
| 8,637,384 B2 | 1/2014 | Ando et al. | |
| 8,901,619 B2 | 12/2014 | Cheng et al. | |
| 9,236,447 B2 | 1/2016 | Cheng et al. | |
| 9,252,233 B2 | 2/2016 | Hsiao et al. | |
| 9,466,570 B1 | 10/2016 | Cheng et al. | |
| 9,508,810 B1 | 11/2016 | Cheng et al. | |
| 9,773,881 B2 | 9/2017 | Cheng et al. | |
| 9,831,346 B1* | 11/2017 | Zang | H01L 29/785 |
| 2018/0069092 A1* | 3/2018 | Samavedan | H01L 29/66545 |
| 2018/0374927 A1* | 12/2018 | Liu | H01L 29/4991 |
| 2019/0067442 A1* | 2/2019 | Lin | H01L 21/823821 |

OTHER PUBLICATIONS

K. Cheng et al., "Air spacer for 10nm FinFET CMOS and beyond." International Electron Devices Meeting, IEDM, 2016, 17.1, 4 pages.
A. B. Sachid et al., "FinFET With Encased Air-Gap Spacers for High-Performance and Low-Energy Circuits," IEEE Electron Device Letters, vol. 38, No. 1, 2017, pp. 16-19.

* cited by examiner

*Primary Examiner* — Didarul A Mazumder
*Assistant Examiner* — Wasiul Haider
(74) *Attorney, Agent, or Firm* — Garg Law Firm, PLLC; Rakesh Garg; Joseph Petrokaitis

(57) ABSTRACT

In a semiconductor device being fabricated, a gate structure, a first source/drain (S/D) structure, and a second S/D structure are formed. A first spacer of a first dielectric material is formed between the gate structure and the first S/D structure. A second spacer is formed between the gate structure and the second S/D structure, such that a first gap is created within a second dielectric material of the second spacer.

15 Claims, 10 Drawing Sheets

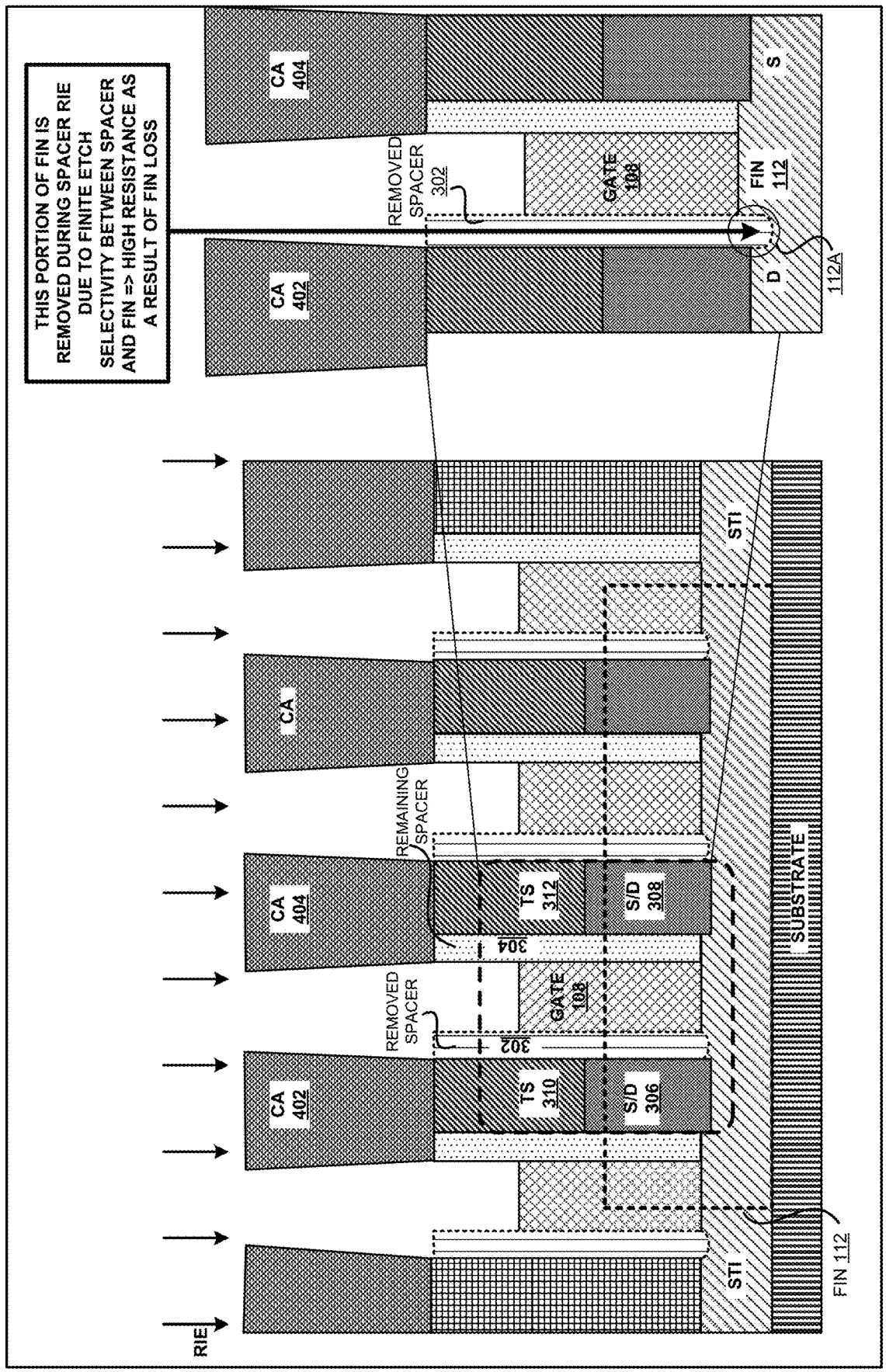

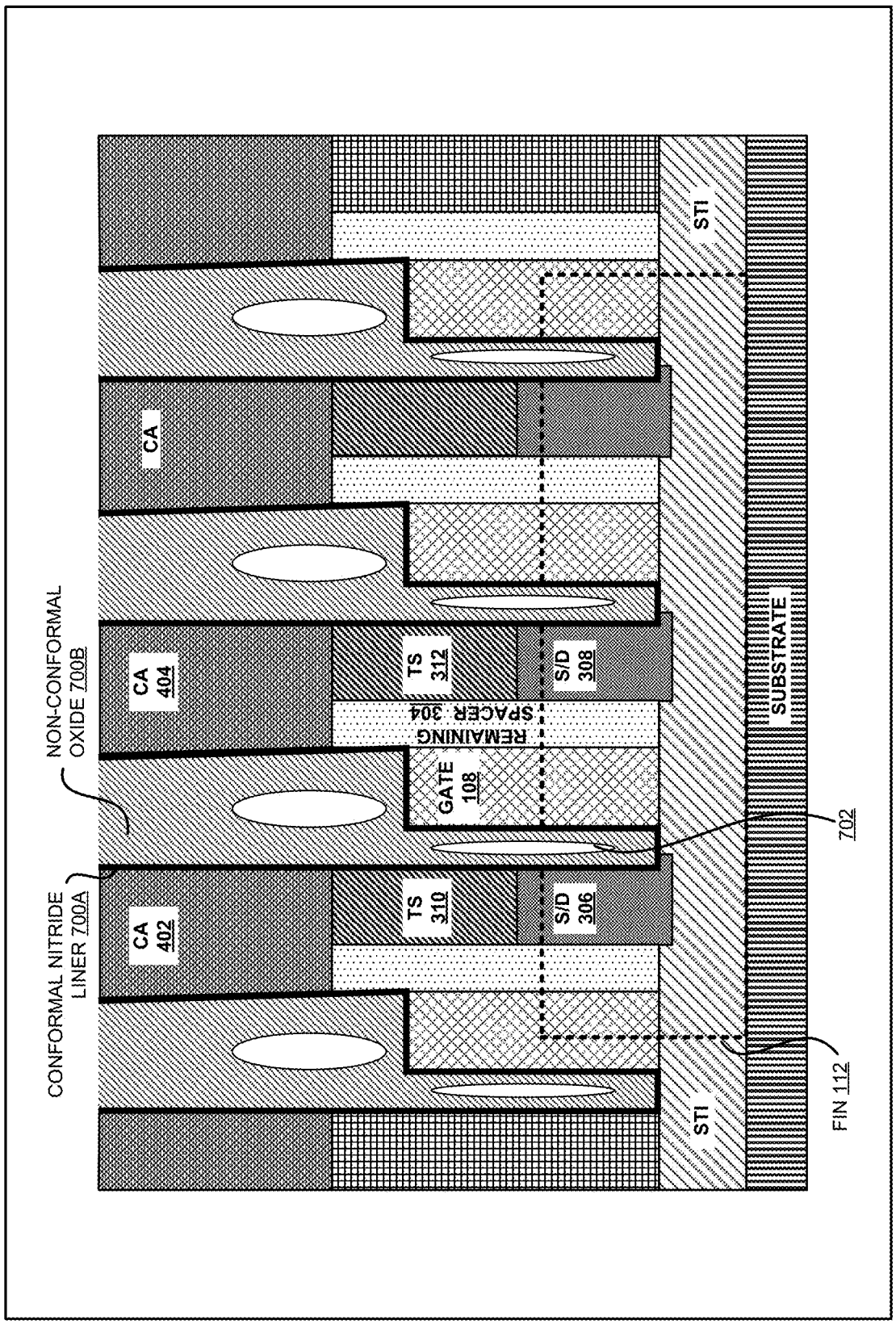

US 10,833,165 B2

ASYMMETRIC AIR SPACER GATE-CONTROLLED DEVICE WITH REDUCED PARASITIC CAPACITANCE

TECHNICAL FIELD

The present invention relates generally to a method, system, and computer program product for fabricating gate-controlled semiconductor devices. More particularly, the present invention relates to a method, system, and computer program product for asymmetric air spacer gate-controlled device with reduced parasitic capacitance.

BACKGROUND

Within the scope of the illustrative embodiments a gate-controlled semiconductor device is a device in which a gate structure controls a flow of electrons through a channel between a source structure and a drain structure. A transistor is a non-limiting example of a gate-controlled semiconductor device, where applying a potential to the gate causes electrical current to flow from a source end of the transistor to a drain end of the transistor.

A Field Effect Transistor (FET) is a specific type of transistor. A Metal Oxide Field Effect Transistor (MOSFET) is a FET fabricated using specific materials, techniques, and is suitable as a transistor for certain uses. A FET controls the electrical conductivity between a source of electric current (source) and a destination of the electrical current (drain). The FET uses a gate structure to create an electric field, which controls the shape and consequently the electrical conductivity of a channel between the source and the drain. The channel is a charge carrier pathway constructed using a semiconductor material.

Many semiconductor devices are planar, i.e., where the semiconductor structures are fabricated on one plane. A non-planar device is a three-dimensional (3D) device where some of the structures are formed above or below a given plane of fabrication.

A finFET is a non-planar device in which a source and a drain are connected using a fin-shaped conducting channel (fin) above the insulator layer. In an FET, a gate has a source-side and a drain-side. Generally, a finFET is fabricated as a multi-gate device in which two or more gates are coupled using one or more fin structures by connecting a drain of one gate to the source of another gate using a fin. For example, a fin of a finFET is usually fabricated between two gates such that the source of one gate is on one side of the fin and the drain of the other gate is on an opposite side of the fin.

A CA contact is an electrical connection that connects to a S/D structure in a finFET. A circuit external to the finFET uses the CA contact to electrically connect a part of the circuit to a source or a drain in the finFET. A CB contact is an electrical connection that connects to a gate. A circuit external to the finFET uses the CB contact to electrically connect a part of the circuit to a gate in the finFET.

SUMMARY

The illustrative embodiments provide a method, system, and computer program product. An embodiment includes a fabrication method that forms a gate structure. The embodiment forms a first source/drain (S/D) structure. The embodiment forms a second S/D structure. The embodiment forms a first spacer between the gate structure and the first S/D structure, comprising a first dielectric material. The embodiment forms forming a second spacer between the gate structure and the second S/D structure, comprising a second dielectric material with a first gap created within the second dielectric material.

An embodiment includes a semiconductor fabrication system. The embodiment includes a processor, a computer-readable memory, and a computer-readable storage device, and program instructions stored on the storage device for execution by the processors via the memories, the stored program instructions causing the fabrication system to perform operations of the fabrication method.

An embodiment includes a semiconductor device. The semiconductor device includes structures formed according to the fabrication method.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

FIG. 6B depicts a detailed view of a removed spacer according to an illustrative embodiment;

FIG. 7 depicts another step in an example process for fabricating an asymmetric air spacer gate-controlled device with reduced parasitic capacitance according to an illustrative embodiment;

DETAILED DESCRIPTION

The illustrative embodiments are described using a transistor, particularly a finFET type MOSFET as a specific example which can be improved in a manner described herein. Any reference to a transistor, finFET, or MOSFET is not intended to be limiting on the illustrative embodiments. An embodiment described herein can be adapted to address similar problems in other devices where parasitic capacitance is to be reduced.

Figure 1:
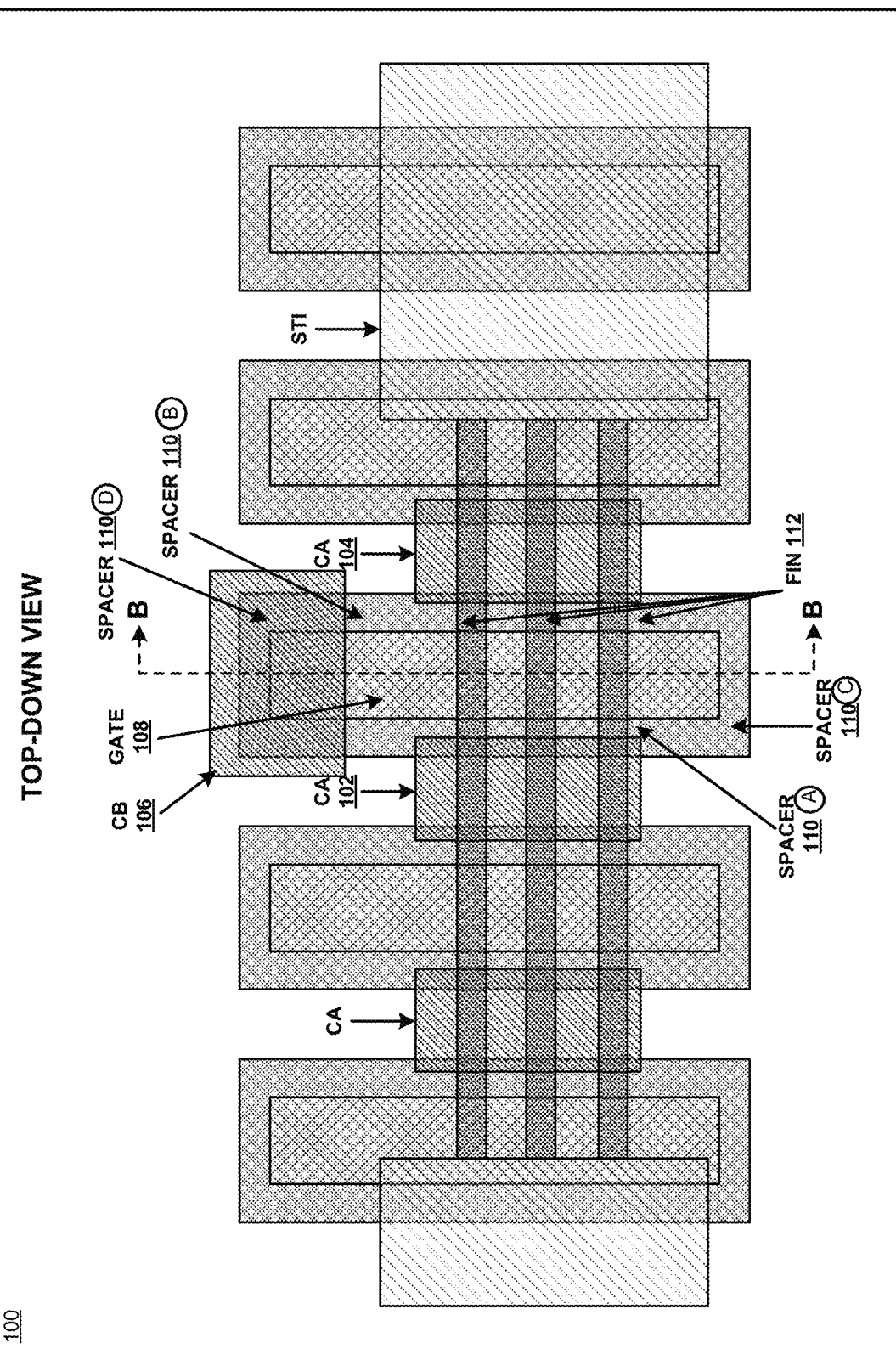
FIG. 1 depicts an example finFET.
Figure 2:
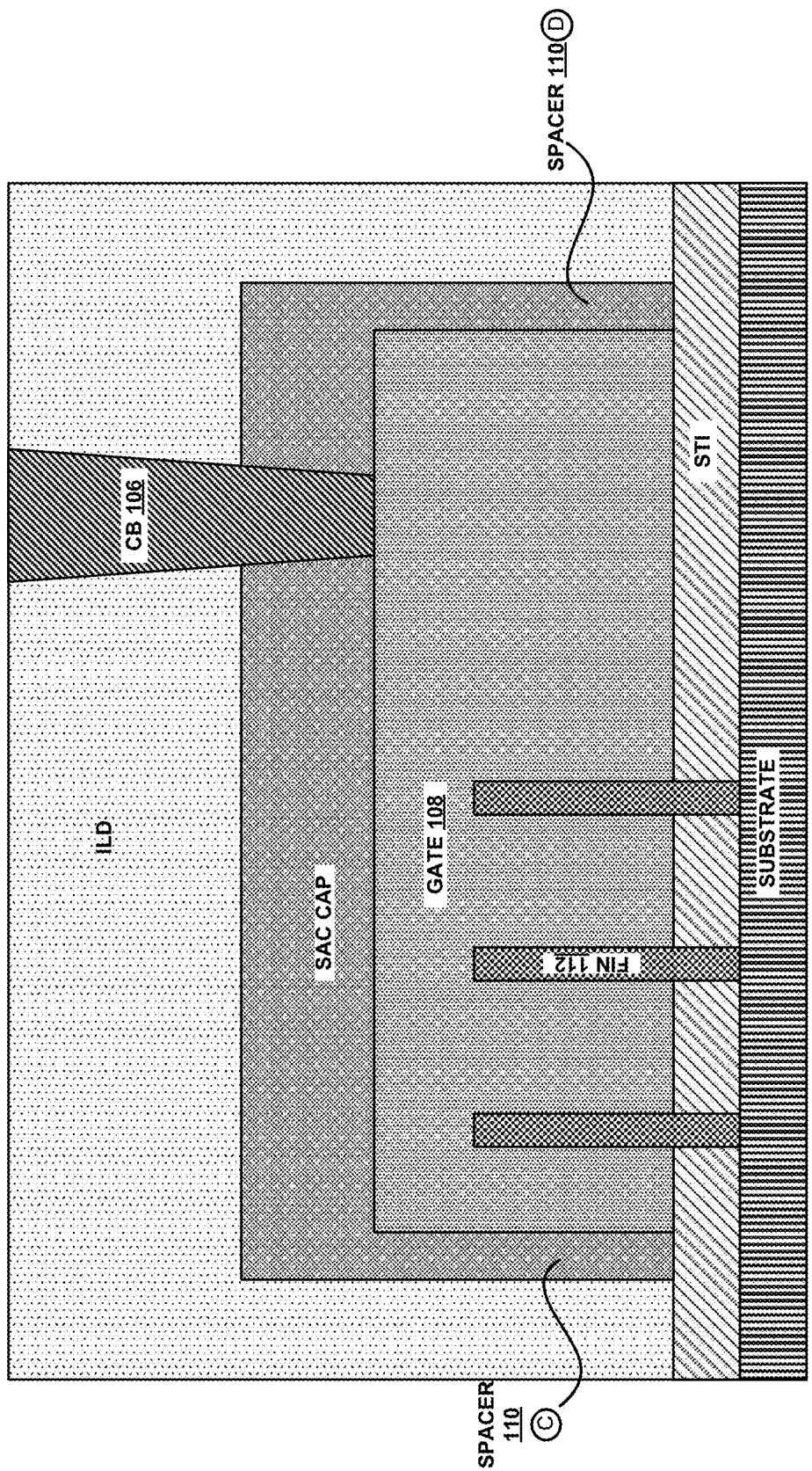
FIG. 2 depicts a cross sectional view of finFET 100 across section line "BB"

FIG. 1 depicts an example finFET. FIG. 2 depicts a cross sectional view of finFET 100 across section line "BB". The illustrative embodiments recognize that finFET 100 is one type of device where two structures are separated by a spacer structure. A spacer is a structure formed using a material having insulating properties. When the spacer lies between two structures that can be conductive, such as between a source and a gate, or between a drain and a gate, the spacer operates to provide electrical insulation between the two structures.

CA 102 is a conductor placed upon a source/drain (S/D) structure (the S/D structure lies below CA 102 and not visible), CA 104 is a conductor placed upon another S/D structure (the S/D structure lies below CA 104 and not visible), and CB 106 is a conductor placed upon gate structure 108. Spacer 110 is formed using an insulator material (e.g., low-k dielectric material, k stands for the dielectric constant) and is shown in this non-limiting depiction as wrapped around gate 108, insulating gate 108 from the source and the drain. Gate 108 controls the current flow from the source (one S/D structure) to the drain (the other S/D structure) via one or more fins 112. Fins 112 form a gate-controlled channel.

In the top-down view of FIG. 1, suppose that CA 102 connects to a first S/D structure, CA 104 connects to another S/D structure, and CB 106 connects to gate 108. The S/D structure coupling to CA 102 can be regarded as a drain of a transistor, the S/D structure coupling to CA 104 can be regarded as a source of the transistor, and gate 108 forming the gate that controls the fin 112 channel of the transistor.

Spacer 110 (labelled spacer 110 instance A) occupies the space between the drain of CA 102 and gate 108. Spacer 110 (labelled spacer 110 instance B) also the space between the source of CA 104 and gate 108. Spacer 110 instance C and spacer 110 instance D are positioned relative to gate 108 and S/D structures as shown.

The illustrative embodiments recognize that this configuration—which is commonly found in gate-controlled devices—creates a problem of parasitic capacitance because of the spacer acting as a dielectric. The source and the gate with the spacer sandwiched in between form a capacitor, which has a capacitance. Similarly, the drain and the gate with the spacer sandwiched in between form another capacitor, which also has a capacitance. This capacitance is undesirable in the operation of the gate-controlled device and is called parasitic capacitance.

The illustrative embodiments recognize that the lower the dielectric constant of the spacer, the lower the parasitic capacitance. The illustrative embodiments also recognize that air has a desirably low dielectric constant. Ideally, if air could be used as spacer 110, the parasitic capacitance would reduce to a tolerable value.

The illustrative embodiments also recognize that the removal of the sandwiched spacers also causes a change in the electrical resistance of fins at the locations of the spacers. The illustrative embodiments recognize that while the resistance and the parasitic capacitance are both undesirable, high resistance is more undesirable than high capacitance on the source side, and high capacitance is more undesirable than high resistance on the drain side due to so-call "Miller effect".

The illustrative embodiments recognize that the resistance of the semiconductor fins under spacer 110 is an important consideration. The part of a semiconductor fin under a spacer is sometimes referred to as a fin extension and the resistance of that portion of the fin is correspondingly referred to as an extension resistance. The fin extension connects the S/D to the fin channel (fin under the gate). The increase of resistance is caused by the process step of removing the original spacer as described herein.

The illustrative embodiments used to describe the invention generally address and solve the above-described needs and other problems related to fabricating an asymmetric air spacer gate-controlled device with reduced parasitic capacitance. The illustrative embodiments provide a fabrication method for asymmetric air spacer gate-controlled device with reduced parasitic capacitance.

An embodiment comprises a semiconductor device described herein. Another embodiment comprises a fabrication process for the contemplated semiconductor device and can be implemented as a software application. The software application implementing an embodiment can be configured as a modification of an existing semiconductor fabrication system—such as a photolithography system, as a separate application that operates in conjunction with an existing semiconductor fabrication system, a standalone application, or some combination thereof. For example, the application causes the semiconductor fabrication system to perform the steps described herein, to fabricate an asymmetric air spacer gate-controlled device with reduced parasitic capacitance, as described herein.

For the clarity of the description, and without implying any limitation thereto, the illustrative embodiments are described using a specific type of gate-controlled device, to wit, generally a MOSFET and specifically a finFET. Within the scope of the illustrative embodiments, an embodiment can be implemented with a variety of other devices, where sandwiched spacer elements pose similar parasitic capacitance problems as are recognized with a finFET.

Furthermore, simplified diagrams of the example structures, elements, and device(s) are used in the figures and the illustrative embodiments. In an actual fabrication of a proposed device, additional structures that are not shown or described herein, or structures different from those shown and described herein, may be present without departing the scope of the illustrative embodiments. Similarly, within the scope of the illustrative embodiments, a shown or described structure in the example device may be fabricated differently to yield a similar operation or result as described herein.

Differently shaded portions in the two-dimensional drawing of the example structures, layers, and formations are intended to represent different structures, layers, and formations in the example fabrication, as described herein. The different structures, layers, and formations may be fabricated using suitable materials that are known to those of ordinary skill in the art as belonging to the same class of materials described herein.

A specific shape, location, position, or dimension of a shape depicted herein is not intended to be limiting on the illustrative embodiments unless such a characteristic is expressly described as a feature of an embodiment. The shape, location, position, dimension, or some combination thereof, are chosen only for the clarity of the drawings and the description and may have been exaggerated, minimized, or otherwise changed from actual shape, location, position, or dimension that might be used in actual photolithography to achieve an objective according to the illustrative embodiments.

Furthermore, the illustrative embodiments are described with respect to a specific actual or hypothetical semiconductor device only as an example. The steps described by the various illustrative embodiments can be adapted for fabricating a variety of planar and non-planar devices in a similar manner, and such adaptations are contemplated within the scope of the illustrative embodiments. The specific contact placements are also used only as non-limiting examples to describe certain options possible with the illustrative embodiments. Those of ordinary skill in the art will be able to use an embodiment to similarly provide electrical access to a layer or structure in a similar manner, and such usage is also contemplated within the scope of the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

A device of an embodiment described herein, comprises substantial advancement of the semiconductor device fabrication technologies. A manner of forming asymmetric air gaps as described herein is unavailable in the presently available methods. Thus, a substantial advancement of such devices or data processing systems by executing a method of an embodiment is in an improved fabrication process where competing objectives are achieved from different portions of spacers in the fabricated device.

The illustrative embodiments are described with respect to certain types of devices, electrical properties, structures, formations, layers, orientations, directions, steps, operations, planes, materials, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures.

The examples in this disclosure are used only for the clarity of the description and are not limiting to the illustrative embodiments. Additional structures, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 3:
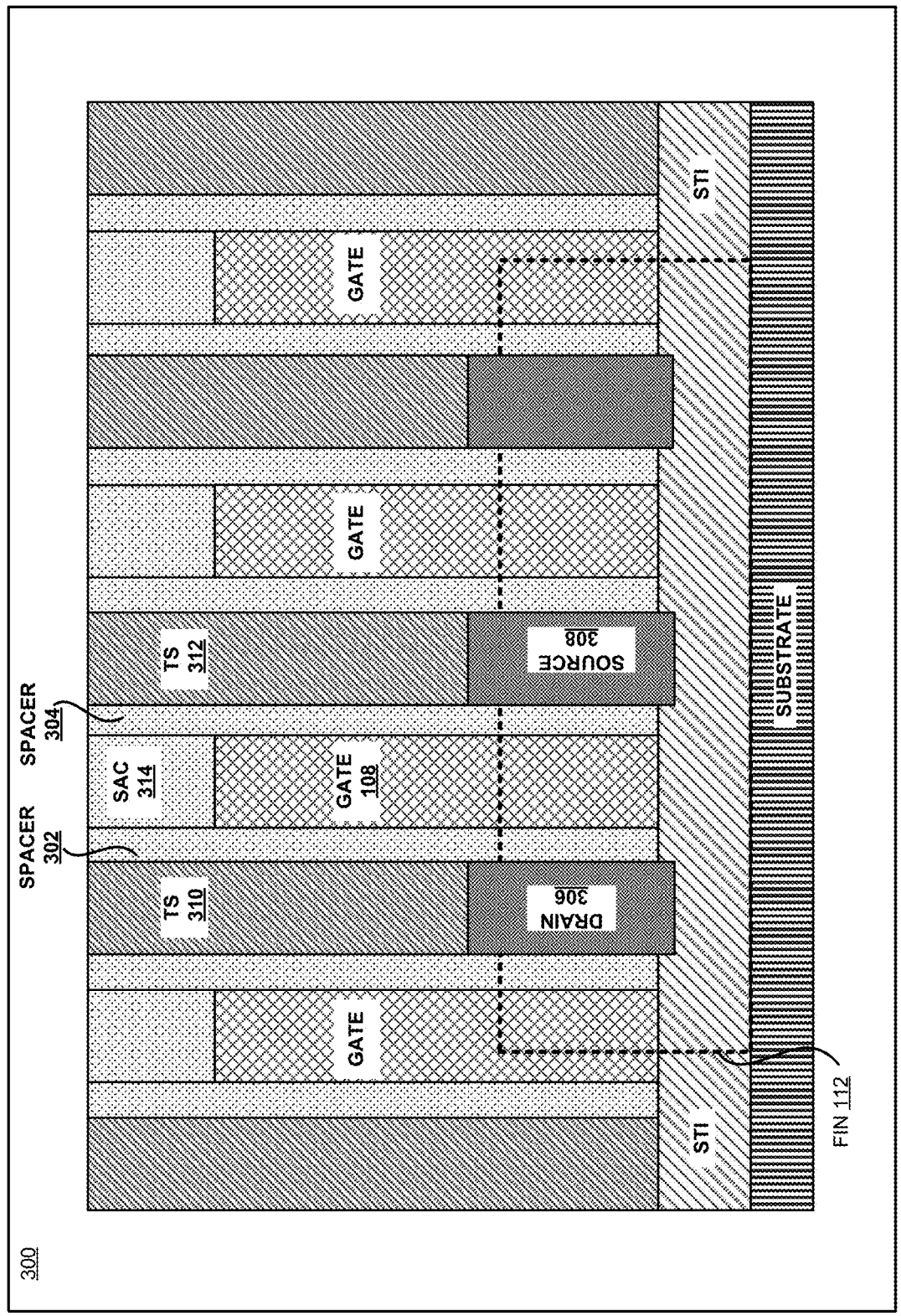
FIG. 3 depicts an example step in fabricating an asymmetric air spacer gate-controlled device with reduced parasitic capacitance according to an illustrative embodiment.

With reference to FIG. 3, this figure depicts an example step in fabricating an asymmetric air spacer gate-controlled device with reduced parasitic capacitance according to an illustrative embodiment. A fabrication process for finFET fabrication uses a wafer of a suitable substrate, such as silicon, and fabricates device 300. Device 300 is a finFET and comprises a set of transistors. Gate 108 and fin 112 are the same as gate 108 and fin 112 in FIG. 1. Gate 108 is fabricated using a gate dielectric (e.g., high-k dielectric) and a gate conductor (e.g., metal).

The substrate contemplated within the scope of the illustrative embodiments can be formed using any suitable substrate material, such as, for example, monocrystalline Si, SiGe, SiC, III-V compound semiconductor, II-VI compound semiconductor, or semiconductor-on-insulator (SOI). In some embodiments of the invention, the substrate includes a buried oxide layer (not depicted). Fins, such as fin 112, are semiconductor structures that are formed using the same material or different materials from the substrate.

Source and drain structures are formed on the opposite sides of a gate, such as gate 108. An S/D structure is offset or separated from the gate by one or more gate spacers, such as spacers 302 and 304. In one example embodiment, source and drain structures are formed from an in-situ doped (i.e., during growth) epitaxial material such as in-situ doped epitaxial Si, carbon doped silicon (Si:C) and/or SiGe. Suitable n-type dopants include but are not limited to phosphorous (P), and suitable p-type dopants include but are not limited to Boron (B). The use of an in-situ doping process is merely an example. For instance, an ex-situ process can be used instead of the in-situ process to introduce dopants into the source and drain structures. Other doping techniques include but are not limited to, ion implantation after the bottom source/drain are formed. Dopant techniques include but are not limited to, ion implantation, gas phase doping, plasma doping, plasma immersion ion implantation, cluster doping, infusion doping, liquid phase doping, solid phase doping, in-situ epitaxy growth, or any suitable combination of those techniques.

Gate spacers, such as spacers 302 and 304, are formed using a suitable spacer material. Some examples of the spacer material include, but are not limited to, SiN, SiC, SiOC, SiCN, BN, SiBN, SiBCN, SiOCN, SiON, and combinations thereof. The spacer material also acts as a dielectric material. The dielectric material used as spacer material can be a suitable low-k (k stands for the relative dielectric constant) material, such as a material having a dielectric constant less than approximately 7, or preferably less than approximately 5.

The gate also acts as a high-k (k stands for the relative dielectric constant) dielectric material. Gate dielectric can comprise any suitable dielectric material, including but not limited to silicon oxide, silicon nitride, silicon oxynitride, other high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k gate dielectric material may further include dopants such as lanthanum, aluminum, magnesium. A gate structure of the gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. In some embodiments, the gate dielectric has a thickness ranging from 1 nm to 5 nm, although less thickness and greater thickness are also contemplated.

Gate conductor can comprise any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), TaC, TaMgC, carbon nanotube, conductive carbon, graphene, or any suitable combination of these materials. The conductive material may further comprise dopants that are incorporated during or after deposition. In some embodiments, the gate may further comprise a workfunction setting layer between the gate dielectric and gate conductor. The workfunction setting layer can be a workfunction metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

TS contact, CA/CB contacts are metallic contact. A metal contact can be formed or filled using, but is not limited to, tungsten (W), aluminum (Al), or copper (Cu), cobalt (Co), which can further include a barrier layer. The barrier layer can be, but is not limited to, titanium nitride (TiN), tantalum nitride (TaN), hafnium nitride (HfN), niobium nitride (NbN), tungsten nitride (WN), or combinations thereof, where the barrier layer can prevent diffusion and/or alloying of the metal contact fill material with the top source drain material, and/or anode/cathode material. In various embodiments, the barrier layer can be conformally deposited in the trench(es) by ALD, CVD, MOCVD, PECVD, or combinations thereof. In various embodiments, the metal fill can be formed by ALD, CVD, and/or PVD to form the electrical contacts.

Spacer 302 is an example of spacer 110 instance A and spacer 304 is an example of spacer 110 instance B in FIG. 1. Drain 306 is an example of S/D structure under CA 102 in FIG. 1, and source 308 is an example of S/D structure under CA 104 in FIG. 1.

TS 310 is a trench contact, usually formed using a conductive material, and is a part of CA 102 to provide electrical connectivity to drain 306. TS 312 is another trench contact, usually also formed using a conductive material, and is a part of CA 104 to provide electrical connectivity to source 308.

Self-aligning gate cap (SAC) 314 is an insulating layer over gate 108. SAC 314 may be formed using the same or different material as spacers 302 and 304. Alternatively, the SAC cap can have different materials from the spacer materials. Contact CB 106 of FIG. 1 (not shown in FIG. 3) is formed through SAC 314 in a Y-Z plane perpendicular to the X-Y plane of FIG. 3 according to a three-dimensional coordinate system formed using X, Y, and Z axes.

For the purposes of the illustrative embodiments, a reference to a transistor in device 300 is a reference to the transistor formed using the second gate shown from the left—gate 108, fin 112, spacers 302 and 304, drain 306 with TS 310, and source 308 with TS 312.

Figure 4:
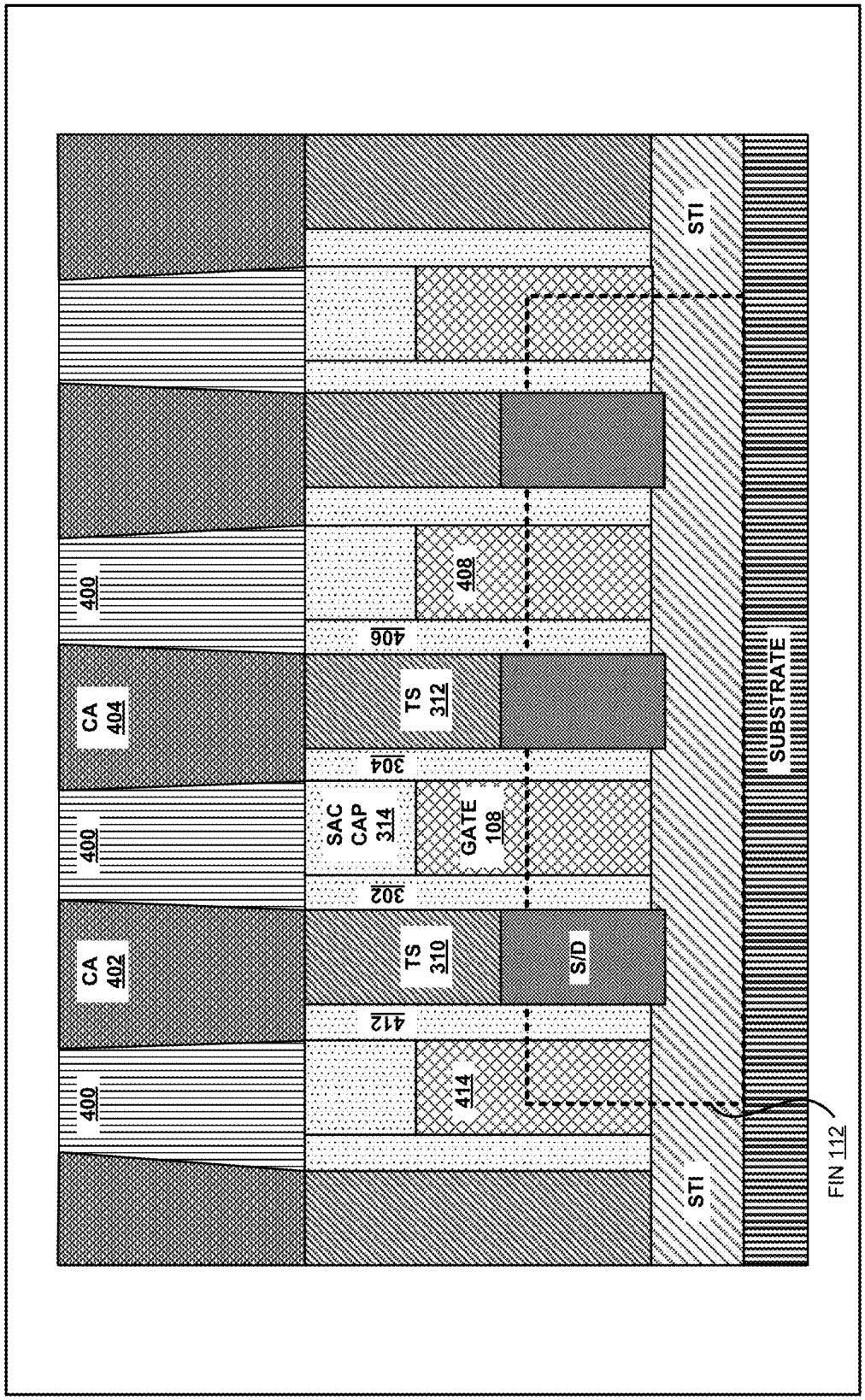
FIG. 4 depicts another step in an example process for fabricating an asymmetric air spacer gate-controlled device with reduced parasitic capacitance according to an illustrative embodiment.

With reference to FIG. 4, this figure depicts another step in an example process for fabricating an asymmetric air spacer gate-controlled device with reduced parasitic capacitance according to an illustrative embodiment. The fabrication process that fabricated device 300 continues according to an embodiment as follows—

The embodiment causes the fabrication process to deposit dielectric (insulator) material 400, such as silicon oxide, over the finFET. The embodiment causes dielectric material 400 to be etched or recessed in the locations where contacts CA and CB (not shown) are to be formed. The embodiment causes a suitable metal to be deposited in the recess to form CA 402 and 404. CA 402 corresponds to CA 102 in FIG. 1 and CA 404 corresponds to CA 104 in FIG. 1, but with a difference.

As can be seen, dielectric 400 is recessed off-center from the corresponding TS below. Specifically, dielectric 400 is recessed, and contact material for CA 404 is deposited in the recess area such that CA 404 contacts TS 312, overlaps spacer 304, and underlaps spacer 406. In other words, CA 404 makes a suitable electrical connection with TS 312, covers or protects source-side spacer 304 of gate 108 but not the drain-side spacer 406 of adjacent gate 408.

Similarly, dielectric 400 is recessed off-center from the corresponding TS 310 below. Specifically, dielectric 400 is recessed, and contact material for CA 402 is deposited in the recess area such that CA 402 contacts TS 310, underlaps spacer 302, and overlaps spacer 412. In other words, CA 402 makes a suitable electrical connection with TS 310, covers or protects source-side spacer 412 of adjacent gate 414 but not the drain-side spacer 302 of gate 108.

Figure 5:
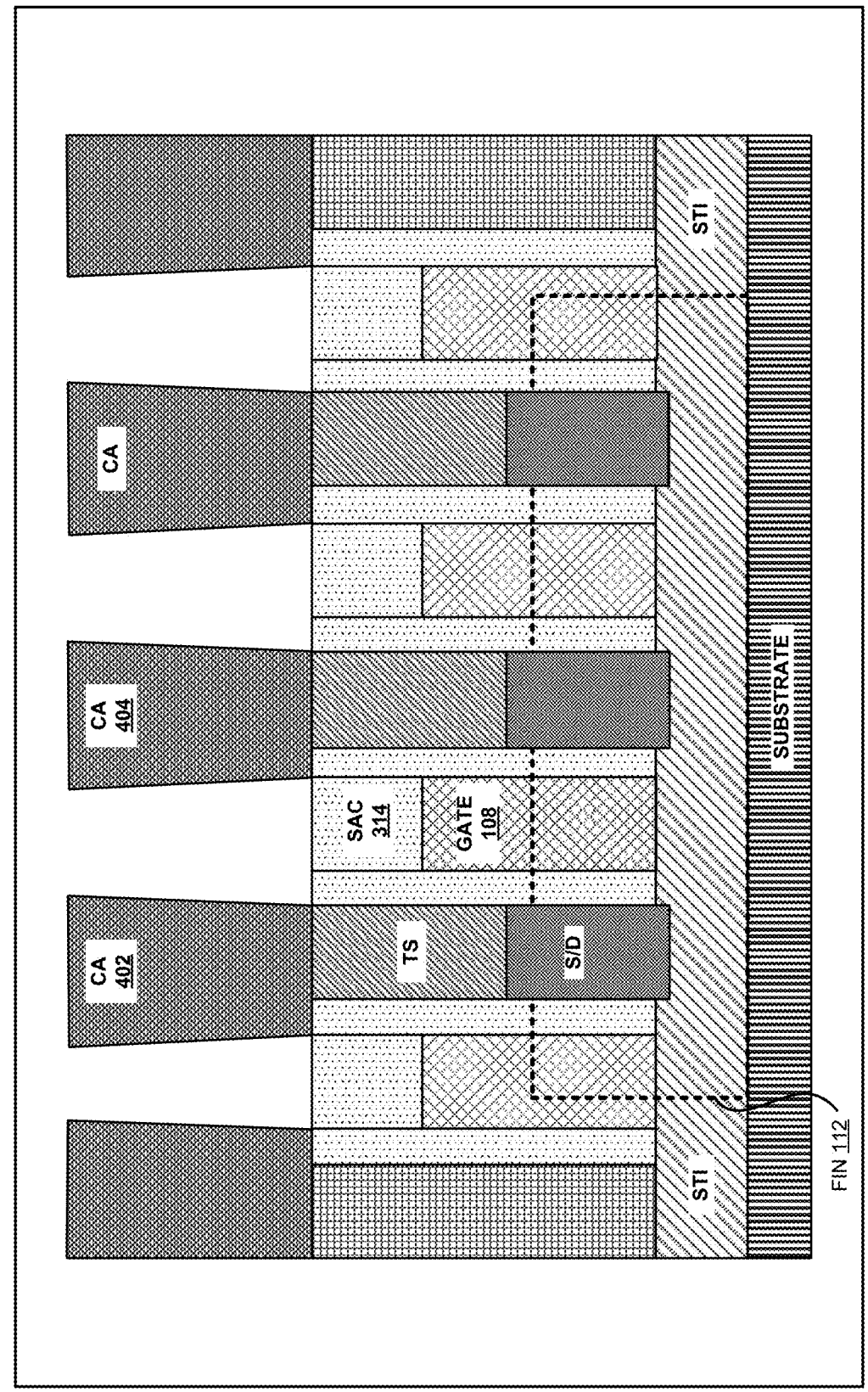
FIG. 5 depicts another step in an example process for fabricating an asymmetric air spacer gate-controlled device with reduced parasitic capacitance according to an illustrative embodiment.

With reference to FIG. 5, this figure depicts another step in an example process for fabricating an asymmetric air spacer gate-controlled device with reduced parasitic capacitance according to an illustrative embodiment. The fabrication process that fabricated CA structures 402 and 404 in FIG. 4 continues according to an embodiment as follows—

The embodiment causes the fabrication process to recess or otherwise remove dielectric 400 from between the CA structures 402 and 402, and other CA structures, that were formed in FIG. 4. The removal of dielectric 400 exposes SAC 314 as well as drain-side spacer 302.

Figure 6A:
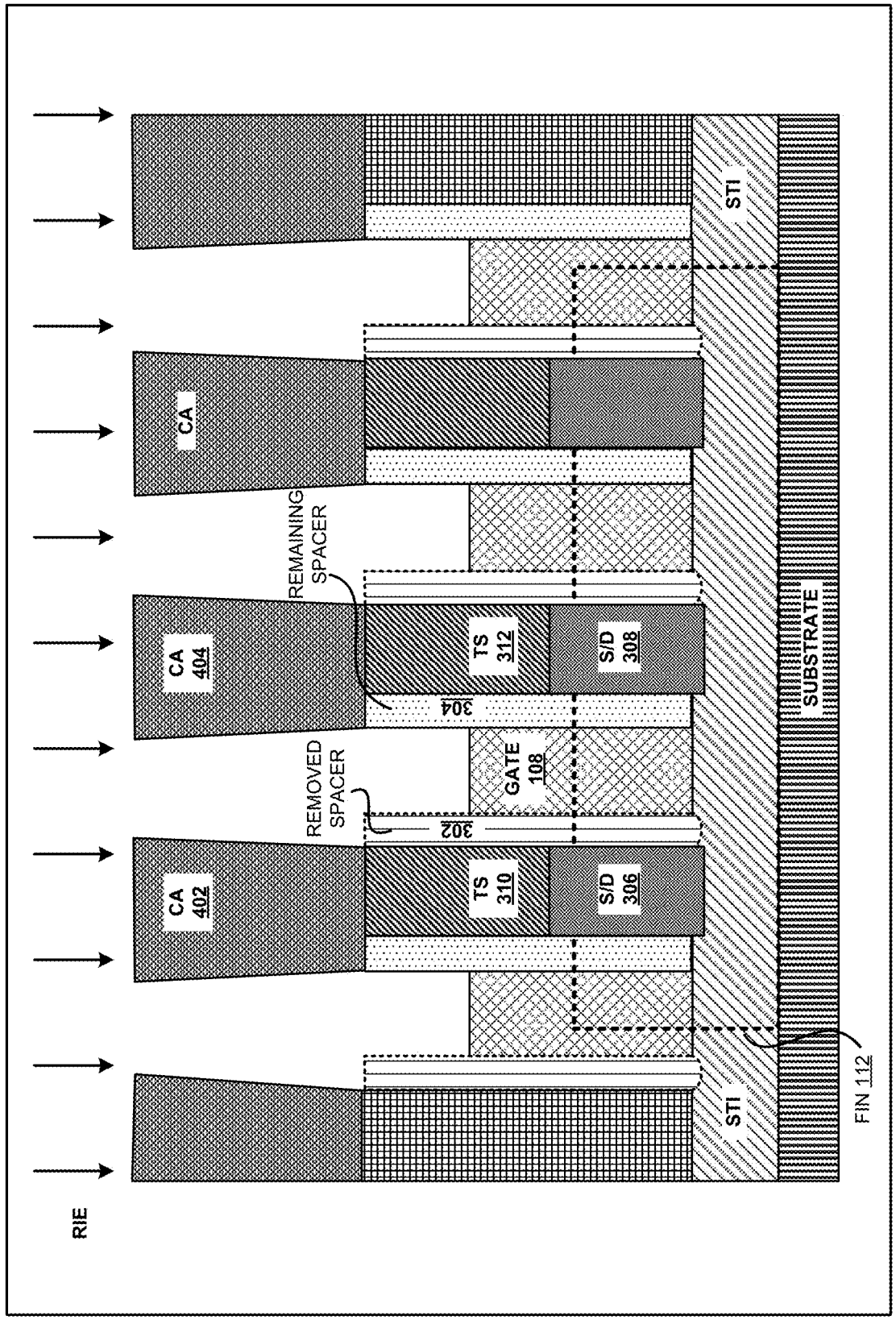
FIG. 6A depicts another step in an example process for fabricating an asymmetric air spacer gate-controlled device with reduced parasitic capacitance according to an illustrative embodiment.

With reference to FIG. 6A, this figure depicts another step in an example process for fabricating an asymmetric air spacer gate-controlled device with reduced parasitic capacitance according to an illustrative embodiment. The fabrication process that exposes SAC 314 and drain-side spacer 302 continues according to an embodiment as follows—

The embodiment causes the fabrication process to remove SAC 314 from above gate 108 and the drain-side spacer 302. For example, the embodiment can use direction reactive ion etch (RIE) for such selective removal of the spacer material and the SAC material. The removal of drain-side spacer 302 causes structure 602 behind the plane of FIG. 6A to show through in the view of FIG. 6A. Source-side spacer 304 is protected by CA 404 and is therefore not removed by the removal process at this step.

With reference to FIG. 6B, this figure depicts a detailed view of a removed spacer according to an illustrative embodiment. The removal process, e.g., RIE process, to remove spacer 302, is presently limited in material and/or depth selectivity for etching. Consequently, during the removal process, some limitation in etch selectivity between spacer 302 and semiconductor fin 112 causes a loss of portion 112A of semiconductor fin 112. The area of fin 112 where portion 112A is lost is called the fin extension. Loss of portion 112A during the etching removal of spacer 302 causes the extension resistance to increase on the drain side under removed spacer 302, as compared to the resistance of the fin extension that is under remaining spacer 304 and suffers no such loss.

With reference to FIG. 7, this figure depicts another step in an example process for fabricating an asymmetric air spacer gate-controlled device with reduced parasitic capacitance according to an illustrative embodiment. The fabrication process that removes SAC 314 drain-side spacer 302 continues according to an embodiment as follows—

The embodiment causes the fabrication process to deposit a dielectric in the space created by the removal of SAC 314 and drain-side spacer 302. The deposited dielectric can be a single dielectric material such as just non-conformal oxide 700B or an equivalent material, or may be layers of more than one type of dielectric material, such as a conformal nitride layer 700A and a non-conformal oxide filling 700B.

While depositing the dielectric in the space, the embodiment causes the fabrication process to pinch-off the dielectric, e.g., the non-conformal oxide material, nitride material, and/or the combination of both. The pinching off causes air gap 702 to be created between gate 108 and the combination of drain 306 and TS 310. Air gap 702 is only formed on the drain-side of gate 108 and not on the source-side where spacer 304 remains intact.

Thus, the resulting device has asymmetric air gap. Air gap 702 causes the low dielectric constant of air to be introduced on the drain-side of gate 108, reducing parasitic capacitance on the drain-side, which is desirable as noted earlier. The asymmetry of spacers on either side of gate 108 leaves spacer 304 of the low-k dielectric material intact, leaving low resistance on the source-side of gate 108, which is also desirable.

An embodiment causes a second pinch-off in the dielectric filler (e.g., non-conformal oxide 700B) at the level of CA 402 and 404. CA 402 and 404 both are metallic, with one or more types of dielectric materials therebetween. This type of sandwiched dielectric would again give rise to parasitic capacitance between CA 402 and 404. It is to avoid this secondary parasitic capacitance that the embodiment causes the second pinch-off forming a second air gap—air gap 704. Now, a low dielectric constant air has been introduced between CA 402 and 404 as well, reducing the secondary parasitic capacitance between CA structures.

Figure 8:
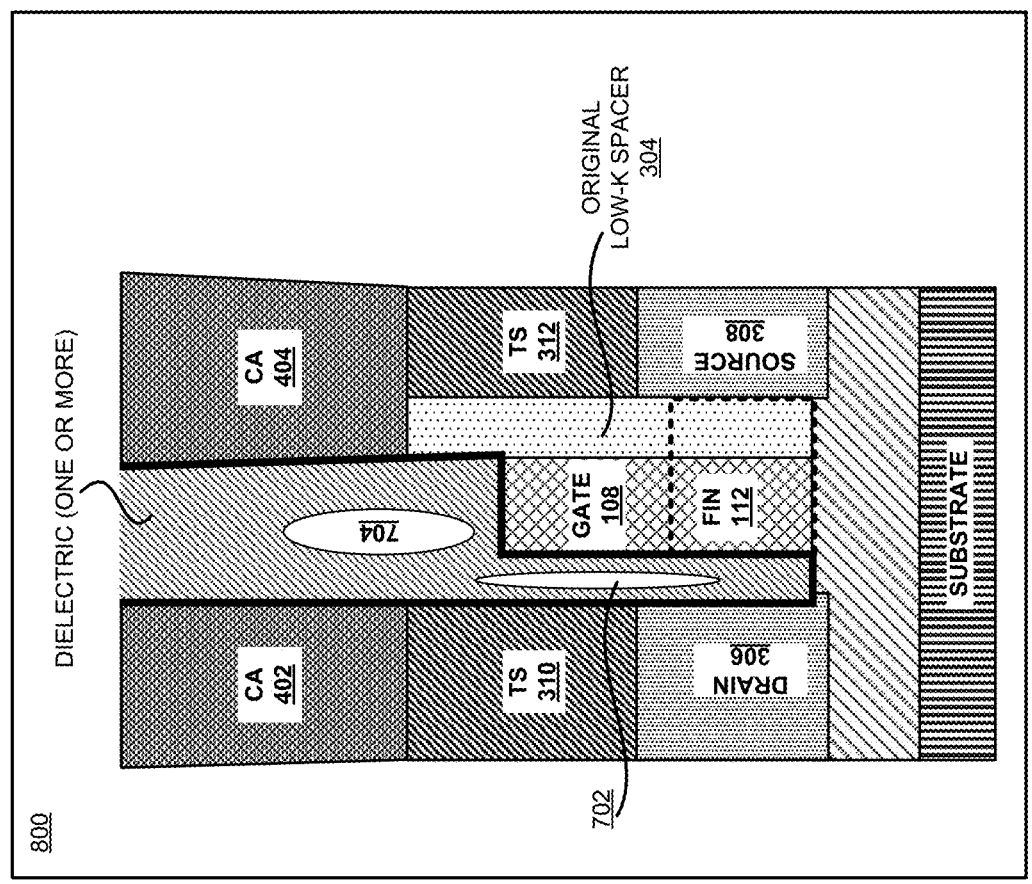
FIG. 8 depicts a bock diagram of an example configuration of an asymmetric air spacer gate-controlled device with reduced parasitic capacitance according to an illustrative embodiment.

With reference to FIG. 8, this figure depicts a bock diagram of an example configuration of an asymmetric air spacer gate-controlled device with reduced parasitic capacitance according to an illustrative embodiment. The fabrication process that pinches off air gaps 702 and 704 results in device 800, which is an asymmetric air spacer gate-controlled device with reduced parasitic capacitance.

Figure 9:
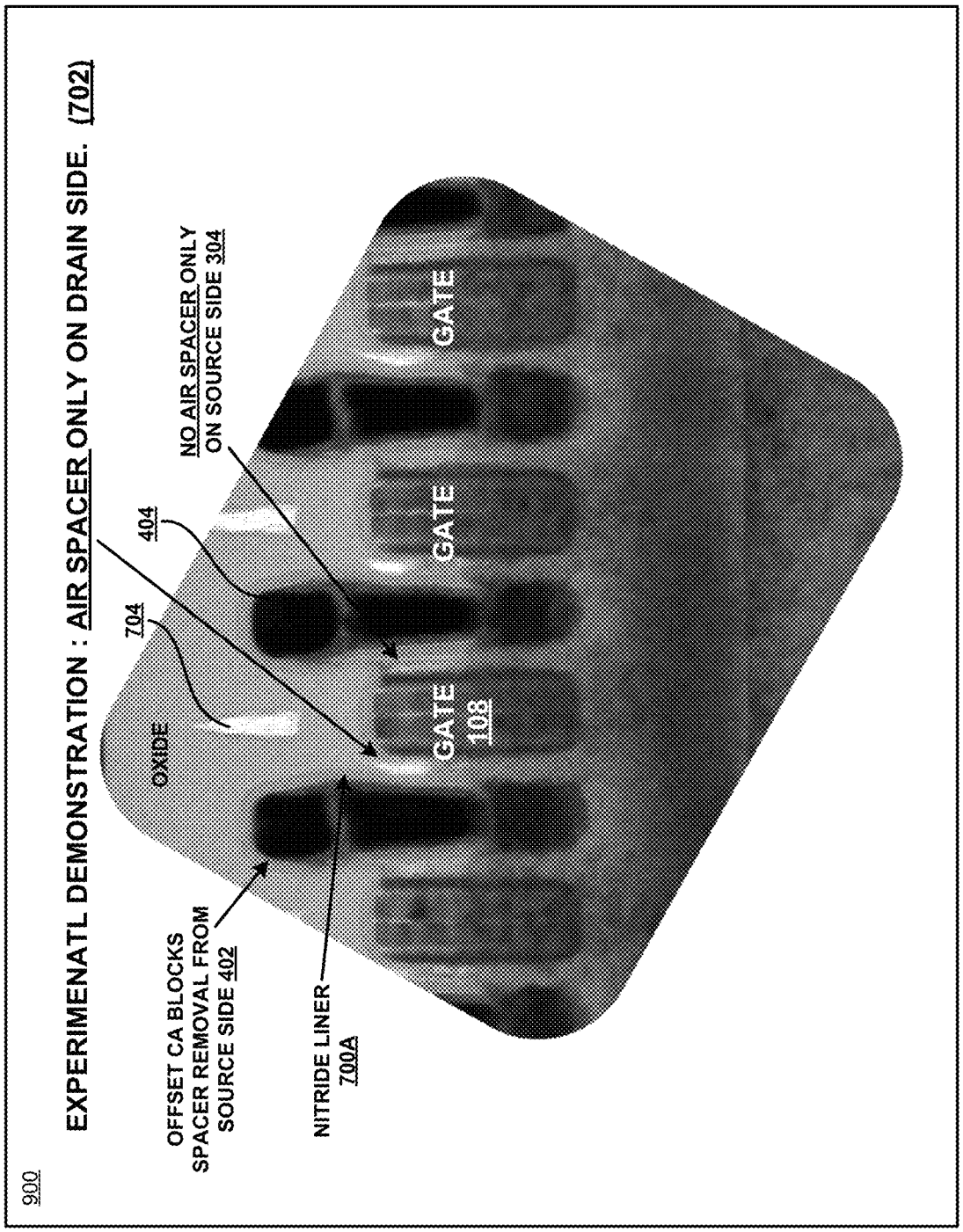
FIG. 9 depicts a microscopic image of an asymmetric air spacer gate-controlled device with reduced parasitic capacitance according to an illustrative embodiment.

With reference to FIG. 9, this figure depicts a microscopic image of an asymmetric air spacer gate-controlled device with reduced parasitic capacitance according to an illustrative embodiment. Image 900 shows asymmetric air gap 702 on drain-side of gate 108, nitride layer 700A, second air gap 704 to reduce secondary parasitic capacitance between offset CA 404 and 404, and remaining low-k spacer 304 on the source-side, which together form an asymmetric air spacer gate-controlled device with reduced parasitic capacitance having properties described herein.

While certain steps and processes are described with certain structures, it is to be understood that the steps and/or processes can be adapted to fabricate any of the structure variations described herein within the scope of the illustrative embodiments. While certain materials are used in multiple layers or structures, it is to be understood that substitute materials or different but functionally equivalent materials can be used in place of the described materials at any layers described herein within the scope of the illustrative embodiments. While certain fabrication methods have been used at certain steps, it is to be understood that a fabrication method may be omitted, added, or modified at a described step to achieve functionally similar result from the semiconductor structure within the scope of the illustrative embodiments. While certain operations are described as a "step," several operations can be combined together to form a single fabrication step in a process described herein. While certain orientations have been referred to as "top" and "bottom" with reference to an example vertical orientation of the proposed device, it is to be understood that the device can be reoriented laterally such that the top and bottom become left/right or right/left, or bottom and top, or front/back or back/front, as the reorientation case may be.

Thus, a semiconductor device, fabrication method therefor, and a fabrication system or apparatus therefor using a software implementation of the method, are provided in the illustrative embodiments for asymmetric air spacer gate-controlled device with reduced parasitic capacitance and other related features, functions, or operations. Where an embodiment or a portion thereof is described with respect to a type of semiconductor device, the fabrication method, system or apparatus, the software implementation, or a portion thereof, are adaptable or configurable for use with a different manifestation of that type of device.

The present invention may be a semiconductor device, system, a method, and/or a computer program product at any possible technical detail level of integration. The computer program product may include a computer readable storage medium (or media) having computer readable program instructions thereon for causing a processor to carry out aspects of the present invention. A computer readable storage medium, including but not limited to computer-readable storage devices as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network.

What is claimed is:

1. A semiconductor device comprising:
   a gate structure;
   a first source/drain (S/D) structure;
   a second S/D structure;
   a drain contact;
   a source contact;
   a first spacer between the gate structure and the first S/D structure, the first spacer being a gap-free spacer comprising a first dielectric material; and a second spacer between the gate structure and the second S/D structure comprising a first portion of a second dielectric material with a first air gap enclosed within the first portion of the second dielectric material, wherein a second portion of the second dielectric material extends between the drain contact and the source contact, and wherein the second portion of the second dielectric material comprises a second air gap enclosed within the second portion of the second dielectric material between the drain contact and the source contact.

2. The semiconductor device of claim 1, wherein the second dielectric material comprises:
a liner layer of a conformal dielectric; and
a filler of a non-conformal dielectric.

3. The semiconductor device of claim 1, wherein the first S/D structure is a source structure.

4. The semiconductor device of claim 1, wherein the second S/D structure is a drain structure.

5. The semiconductor device of claim 1, wherein the first air gap comprises a third material having a first dielectric constant and wherein the first dielectric material has a second dielectric constant, the second dielectric constant exceeding the first dielectric constant.

6. The semiconductor device of claim 1, wherein the second air gap causes a lower capacitance between the drain contact and the source contact as compared to a capacitance caused by the first spacer between the gate structure and the first S/D structure.

7. The semiconductor device of claim 1, wherein removing the second spacer causes an increase in a resistance of a fin extension, wherein the second spacer overlies the fin extension.

8. A semiconductor fabrication system comprising a processor, a computer-readable memory, and a computer-readable storage device, and program instructions stored on the storage device for execution by the processor via the memory, the program instructions causing the semiconductor fabrication system to perform operations comprising:
forming a gate structure;
forming a first source/drain (S/D) structure;
forming a second S/D structure;
forming a drain contact;
forming a source contact;
forming a first spacer between the gate structure and the first S/D structure, the first spacer being a gap-free spacer comprising a first dielectric material; and
forming a second spacer between the gate structure and the second S/D structure comprising a first portion of a second dielectric material with a first air gap enclosed within the first portion of the second dielectric material, wherein a second portion of the second dielectric material extends between the drain contact and the source contact, and wherein the second portion of the second dielectric material comprises a second air gap enclosed within the second portion of the second dielectric material between the drain contact and the source contact.

9. The semiconductor fabrication system of claim 8, wherein the second dielectric material comprises:
a liner layer of a conformal dielectric; and
a filler of a non-conformal dielectric.

10. The semiconductor fabrication system of claim 8, wherein the first S/D structure is a source structure.

11. The semiconductor fabrication system of claim 8, wherein the second S/D structure is a drain structure.

12. The semiconductor fabrication system of claim 8, wherein the first air gap comprises a third material having a first dielectric constant and wherein the first dielectric material has a second dielectric constant, the second dielectric constant exceeding the first dielectric constant.

13. The semiconductor fabrication system of claim 8, wherein the second air gap causes a lower capacitance between the drain contact and the source contact as compared to a capacitance caused by the first spacer between the gate structure and the first S/D structure.

14. The semiconductor fabrication system of claim 8, wherein removing the first spacer causes an increase in a resistance of a fin extension, wherein the first spacer overlies the fin extension.

15. A method comprising:
forming a gate structure;
forming a first source/drain (S/D) structure;
forming a second S/D structure;
forming a drain contact;
forming a source contact;
forming a first spacer between the gate structure and the first S/D structure, the first spacer being a gap-free spacer comprising a first dielectric material; and
forming a second spacer between the gate structure and the second S/D structure comprising a first portion of a second dielectric material with a first air gap enclosed within the first portion of the second dielectric material, wherein a second portion of the second dielectric material extends between the drain contact and the source contact, and wherein the second portion of the second dielectric material comprises a second air gap enclosed within the second portion of the second dielectric material between the drain contact and the source contact.

* * * * *